(12) United States Patent
Abe

(10) Patent No.: US 8,542,016 B2
(45) Date of Patent: Sep. 24, 2013

(54) MAGNETIC RESONANCE IMAGING APPARATUS AND METHOD

(75) Inventor: Takayuki Abe, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 349 days.

(21) Appl. No.: 13/127,833

(22) PCT Filed: Oct. 23, 2009

(86) PCT No.: PCT/JP2009/068222
§ 371 (c)(1),
(2), (4) Date: May 5, 2011

(87) PCT Pub. No.: WO2010/053012
PCT Pub. Date: May 14, 2010

(65) Prior Publication Data
US 2011/0210736 A1  Sep. 1, 2011

(30) Foreign Application Priority Data
Nov. 7, 2008  (JP) .................................. 2008-286689

(51) Int. Cl.
*G01V 3/00* (2006.01)

(52) U.S. Cl.
USPC .......................................... 324/318; 324/309

(58) Field of Classification Search
USPC ..................... 324/300–322; 600/407–445
See application file for complete search history.

(56) References Cited

U.S. PATENT DOCUMENTS
5,609,153 A * 3/1997 Dumoulin et al. ............ 600/410
7,684,847 B2 * 3/2010 Itagaki et al. ................. 600/413

OTHER PUBLICATIONS

International Search Report in PCT/JP2009/068222.
Fautz, Hans-Peter, et al. (2002), "Homogeneous Preparation Encoding (HoPE) in Multislice Imaging," Magnetic Resonance in Medicine, vol. 48, pp. 745-752.
Kuribayashi, Hideto, et al. (2004), "Effective Blood Signal Suppression Using Double Inversion-Recovery and Slice Reordering for Multislice Fast Spin-Echo MRI and its Application in Simultaneous Proton Density and $T_2$ Weighted Imaging," Journal of Magnetic Resonance Imaging, vol. 20, pp. 881-888.

* cited by examiner

*Primary Examiner* — Brij Shrivastav
(74) *Attorney, Agent, or Firm* — Cooper & Dunham LLP

(57) ABSTRACT

A magnetic resonance imaging apparatus for imaging a plurality of different slice planes having pre-pulse applying means configured to apply a pre-pulse for affecting in-plane magnetization of all slices of a measurement target, measuring means configured to make a measurement for applying one phase encode amount for one slice plane to obtain an echo signal and dispose the echo signal in a k space, and control means configured to control operations of the pre-pulse applying means and the measuring means. The control means has first control means configured to control to repeat an operation of executing the measurement once according to a predetermined order for all slice planes of the measurement target after a first pre-pulse is applied while a phase encode amount is varied in a predetermined order until all k spaces of all slices are filled, and second control means configured to control the pre-pulse applying means so that the pre-pulse is applied every time the measurement is executed at a frequency which is different from the number of the slices of the measurement target and a multiple number of the number of the slices, and the first control means sets an initial phase encode amount of each slice so as to measure a low spatial frequency area of the k space at a timing having a large effect of the pre-pulse.

14 Claims, 13 Drawing Sheets

MAGNETIC RESONANCE IMAGING APPARATUS AND METHOD

TECHNICAL FIELD

The present invention relates to a nuclear magnetic resonance imaging (hereinafter referred to as "MRI") technique for detecting nuclear magnetic resonance (hereinafter referred to as "NMR") from hydrogen, phosphorus, etc. in an examinee and imaging a nucleus density distribution, a relaxation time distribution or the like. Particularly, the present invention relates to a technique in which a pre-pulse for bringing an NMR signal with a prescribed effect is applied to perform image pickup before a detection procedure of the NMR signal for imaging is executed.

BACKGROUND ART

When a living tissue is placed under uniform magnetostatic field (hereinafter referred to as BO. In this description, a BO direction is defined as z direction) in an MRI device, the magnetic moment of atomic nuclear spins of tissue composition molecules makes a precession movement around the BO direction at a resonance frequency inherent to each spin. When these spins are exposed to magnetic field (irradiation radio-frequency magnetic field B1) having a frequency near to the resonance frequency from a direction perpendicular to the BO direction, a net magnetic moment M is rotated (excited) toward x-y plane, a net transverse magnetic moment occurs. Thereafter, when the irradiation radio-frequency magnetic field B1 is turned off, the excited magnetic moment is returned (relaxed) to the original state while emitting energy (NMR signal). At this time, the MRI device detects the emitted NMR signal (echo signal), and subjects the NMR signal to signal processing to obtain an image of a living tissue (actual imaging).

In this case, there is a technique of applying a pre-pulse having specific radio-frequency magnetic field before actual imaging to bring the emitted echo signal with some effect. For example, there is known a technique (CHESS method) for applying a pre-pulse called as a CHESS (Chemical Shift Suppression) pulse to suppress an echo signal from hydrogen protons of fat molecules (hereinafter abbreviated as "fat proton") and imaging only a signal from water molecules (for example, see non-patent document 1). According to the CHESS method, a radio-frequency magnetic field (hereinafter abbreviated as "RF") pulse of a fixed magnetic intensity (in this case, a flip angle is 90°) having a resonance frequency of fat protons is applied as a CHESS pulse to a living body to selectively excite only the fat protons before actual imaging, and then a crusher gradient magnetic field pulse is applied. Accordingly, transverse magnetization of the fat protons which are selectively excited by the CHESS pulse are subjected to phase dispersion to vanish the magnetization of the fat protons just before the actual imaging, thereby suppressing the signal from the fat protons.

In general, the effect of the pre-pulse is reduced with time lapse. For example, according to the CHESS method, the longitudinal magnetization of fat protons recovers on the basis of the longitudinal relaxation time of the fat protons as the time elapses just after the CHESS pulse is applied. Therefore, a signal collected just after the CHESS pulse is applied have a fat suppression effect, and the fat suppression effect is reduced as the time elapses from the application of the CHESS pulse.

Multi-slice imaging using the pre-pulse as described above is performed. For example, FIG. 12(a) is a sequence diagram in the multi-slice imaging using a CHESS pulse. Here, only a pulse sequence on the RF axis is shown. In the multi-slice imaging, a signal of one slice is generally obtained during a repeat period TR for another slice, thereby shortening the imaging time. At this time, in order to obtain a sufficient CHESS pulse effect for each slice, a CHESS pulse 201 is applied just before each exciting pulse 202 of actual imaging is applied as shown in FIG. 12(a). A number affixed to each exciting pulse 202 represents a slice number representing a slice order of slice for a measurement target. In this example, N slices of slice numbers from 1 to N are successively imaged in this order.

FIG. 12(b) is a schematic diagram showing a repeat loop of the multi-slice imaging, and an inner loop corresponds to a subordinate loop. As shown in FIG. 12(b), the measurement is executed with the amount of one phase encode for the number of times corresponding to the number of slices, and is repeated for the number of required phase encode steps while varying the phase encode amount.

PRIOR ART DOCUMENT

Non-Patent Document

Non-patent Document 1: A. Hasse, J. Frahm, et al: H1 NMR chemical Shift selective (CHESS) imagin. Phys. Med. Biol. 30, 341 (1985)

SUMMARY OF THE INVENTION

Problem to be Solved by the Invention

According to the above method, since the CHESS pulse is applied every time the exciting pulse of each slice is applied, excellent fat-suppressed images are obtained for all slices. However, the repeat time TR is lengthened due to insertion of the CHESS pulse, and thus the imaging time extends. Furthermore, SAR (Specific Absorption Rate) is also increased due to the CHESS pulse which is frequently applied.

There is known a system for applying the CHESS pulse once every time all slices are measured once in order to shorten the imaging time and reduce SAR. FIG. 13(a) is a sequence diagram on the RF axis of this system, and shows a relaxation aspect of longitudinal magnetization Mz (303) of fat excited by a CHESS pulse 301 at that time. 302 represents an exciting pulse of each slice, and an affixed number represents a slice number. FIG. 13(b) shows a repeat loop of the measurement based on this system.

In the system shown in FIG. 13, a first half slice measured just after a CHESS pulse is applied has a high fat suppression effect and thus an excellent fat-suppressed image is obtained. However, a last half slice measured when some time elapses from the application of the CHESS pulse has a low fat suppression effect and thus no desired fat-suppressed image is obtained.

The present invention has been implemented in view of the foregoing situation, and has an object to provide a technique that can obtain an excellent pre-pulse effect for all slices with suppressing a pre-pulse applying frequency in multi-slice imaging using a pre-pulse.

Means of Solving the Problem

According to the present invention, in multi-slice imaging using a pre-pulse, k space is divided into segments whose number is different from the number of slices in a phase encode direction, slices and segments to be measured every application of a pre-pulse are respectively varied in predetermined orders, and measurement is performed until the segments to be measured loop back. At this time, the measurement order of the segments is set so that the measurement of segments in a low spatial frequency area in k space is performed at a timing having the highest pre-pulse effect.

Specifically, there is provided a magnetic resonance imaging apparatus for imaging a plurality of different slice planes characterized by comprising: pre-pulse applying means configured to apply a pre-pulse for affecting in-plane magnetization of all slices of a measurement target; measuring means configured to make a measurement for applying one phase encode amount for one slice plane to obtain an echo signal and disposing the echo signal in a k space; and control means configured to control operations of the pre-pulse applying means and the measuring means, wherein the control means has first control means configured to control to repeat an operation of executing the measurement once according to a predetermined order for all slice planes of the measurement target after a first pre-pulse is applied while a phase encode amount is varied in a predetermined order until all k spaces of all slices are filled, and second control means configured to control the pre-pulse applying means so that the pre-pulse is applied every time the measurement is executed at a frequency which is different from the number of the slices of the measurement target and a multiple number of the number of the slices, and the first control means sets an initial phase encode amount of each slice so as to measure a low spatial frequency area of the k space at a timing having a large effect of the pre-pulse.

Furthermore, there is provided a magnetic resonance imaging method for imaging a plurality of different slice planes, characterized by comprising: a pre-pulse applying step that applies a pre-pulse for affecting in-plane magnetization of all slices of a measurement target; a measuring step that makes a measurement for applying one phase encode amount for one slice plane to obtain an echo signal and disposing the echo signal in a k space; and a control step that controls operations of the pre-pulse applying means and the measuring means, wherein the control step has a first control step that controls to repeat an operation of executing the measurement once according to a predetermined order for all slice planes of the measurement target after a first pre-pulse is applied while a phase encode amount is varied in a predetermined order until all k spaces of all slices are filled, and a second control step that controls the pre-pulse applying means so that the pre-pulse is applied every time the measurement is executed at a frequency which is different from the number of the slices of the measurement target and a multiple number of the number of the slices, and the first control step sets an initial phase encode amount of each slice so as to measure a low spatial frequency area of the k space at a timing having a large effect of the pre-pulse.

Effect of the Invention

According to the present invention, in the multi-slice imaging, an excellent pre-pulse effect can be obtained for all slices with suppressing an application frequency of the pre-pulse.

MODES FOR CARRYING OUT THE INVENTION

First Embodiment

Figure 1:
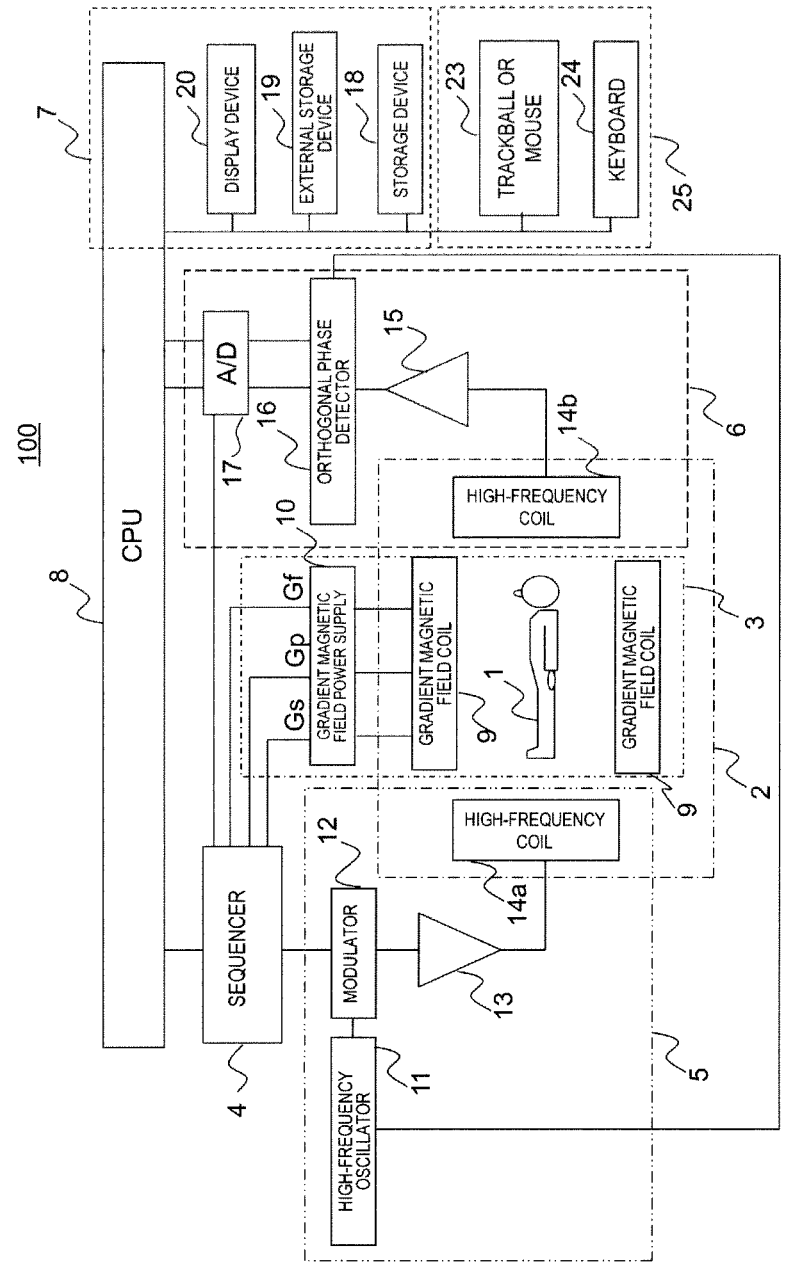
FIG. 1 is a block diagram showing the overall construction of an MRI device according to an embodiment of the present invention.

Embodiments to which the present invention is applied will be described hereunder. In all the figures showing embodiments of the present invention, elements having the same functions are represented by the same reference numerals, and the repetitive description thereof is omitted.

First, the overall construction of the MRI device according to the embodiment will be described. FIG. 1 is a block diagram showing the overall construction of the MRI device 100 according to the embodiment. The MRI device 100 according to this embodiment obtains a tomographic image of an examinee by using an NMR phenomenon, and it has a magnetostatic field generating system 2, a gradient magnetic field generating system 3, a transmission system 5, a reception system 6, a signal processing system 7, a sequencer 4 and a central processing unit (CPU) 8.

The magnetostatic field generating system 2 generates uniform magnetostatic field in a direction perpendicular to the body axis of an examinee 1 in a space around the examinee 1 in the case of a vertical magnetic field system or generates uniform magnetostatic field in a direction of the body axis of the examinee 1 in the case of a horizontal magnetic field system, and it is implemented by a magnetostatic field generating source of a permanent magnet type, a normal conduction type or a superconduction type which is disposed around the examinee 1.

The gradient magnetic field generating system 3 has gradient magnetic field coils 9 wound in three axis directions of X, Y and Z of the coordinate system (coordinate system at rest) of the MRI device 100, and gradient magnetic field power supplies 10 for driving the respective gradient magnetic coils, respectively. The gradient magnetic field power supplies 10 of the respective gradient magnetic field coils are driven according to an instruction from a sequencer 4 described later, whereby gradient magnetic fields Gx, Gy, Gz are applied in the three axis directions of X, Y and Z. Under imaging operation, a slice-direction gradient magnetic field pulse (Gs) is applied in a direction perpendicular to a slice plane (imaging cross-section) to set the slice plane for the examinee 1. Furthermore, a phase encode direction gradient magnetic field pulse (Gp) and a frequency encode direction gradient magnetic field pulse (Gf) are applied in the residual two directions which are perpendicular to the slice plane and also perpendicular to each other, thereby encoding position information of the respective directions in an echo signal.

The transmission system 5 irradiates a radio-frequency magnetic field (RF) pulse to the examinee 1 to induce nuclear magnetic resonance in atomic nuclear spins of atoms constituting the living tissue of the examinee 1, and it has a high-frequency oscillator 11, a modulator 12, a high-frequency amplifier 13, and a high-frequency coil (transmission coil) 14a at the transmission side. An RF pulse output from the high-frequency oscillator 11 is subjected to amplitude modulation by the modulator 12 at a timing based on an instruction from a sequencer 4 described later, amplified by the high-frequency amplifier 13 and irradiated to the examinee 1 from the transmission coil 14a disposed in proximity to the examinee 1.

The reception system 6 detects an echo signal (NMR signal) emitted through the nuclear magnetic resonance of the atomic nuclear spins of atoms constituting the living tissue of the examinee 1, and it has a high-frequency coil (reception coil) 14b at the reception side, a signal amplifier 15, an orthogonal phase detector 16 and an A/D converter 17. The responsive NMR signal induced by the RF pulse irradiated from the transmission coil 14a is detected by the reception coil 14b disposed in proximity to the examinee 1, amplified by the signal amplifier 15 and divided into orthogonal signals of two systems by the orthogonal phase detector 16 at the timing based on the instruction from the sequencer 4 described later, and the signals are converted to digital amounts in an A/D converter 17 and transmitted as measurement data to the signal processing system 7.

The sequencer 4 controls to repetitively apply the RF pulse and the gradient magnetic field pulse according to a predetermined pulse sequence, and it operates under the control of CPU 8 to transmit various instructions necessary for data collection to reconstruct a tomographic image of the examinee 1 to the transmission system 5, the gradient magnetic field generating system 3 and the reception system 6. The transmission system 5 and the gradient magnetic field generating system 3 control the application timing, period and intensity of the RF pulse and the application timing, period and intensity of the gradient magnetic field pulse according to the instruction from the sequencer 4. The reception system 6 detects the echo signal according to the instruction from the sequencer 4. The pulse sequence is prepared according to a measurement object in advance, and stored as a program and data in a storage device 18 described later, etc.

The signal processing system 7 executes various kinds of data processing, displays and stores processing results, etc., and it is constructed by CPU 8, the storage device 18 such as ROM, RAM or the like, an external storage device 19 such as an optical disk, a magnetic disk or the like, and a display device 20. When measurement data from the reception system 6 is input to CPU 8, CPU 8 executes signal processing, image reconstruction processing, etc., and it displays a tomographic image of the examinee 1 as a processing result on the display device 20 and records the tomographic image into the storage device 18 or the external storage device 19.

An operating unit 25 receives an input of various kinds of control information of the MRI device 100 itself and various kinds of control information of processing to be executed by the signal processing system 7, and it has a trackball or a mouse 23, and a keyboard 24. The operating unit 25 is disposed in proximity to the display device 20, and an operator interactively inputs information necessary for various kinds of processing of the MRI device 100 through the operating unit 25 while viewing the display device 20.

In FIG. 1, the transmission coil 14a and the gradient magnetic field coil 9 are arranged so as to face the examinee 1 in the case of the vertical magnetic field system or surround the examinee 1 in the case of the horizontal magnetic field system in the magnetostatic space of the magnetostatic field generating system 2 in which the examinee 1 is inserted. Furthermore, the reception coil 14b is disposed so as to face the examinee 1 or surround the examinee 1.

Imaging target nuclear species of the present MRI device are hydrogen atomic nucleus (protons) as main constituent material of the examinee which have been widely used. Information on a spatial distribution of proton density or a spatial distribution of relaxation time of an excited state is imaged, whereby the shapes or functions of a head portion, an abdominal part, a four limbs, etc. of a human body are two-dimensionally or three-dimensionally imaged.

In this embodiment, in the multi-slice imaging using the pre-pulse in combination, the pulse sequence is constructed so that data of a low spatial frequency spatial area of the k space of each slice can be obtained at a timing having the highest pre-pulse effect, and the imaging is controlled. The pulse sequence of this embodiment for implementing this will be described hereunder. In this case, a case where a CHESS pulse is used as a pre-pulse will be described as an example.

Figure 2:
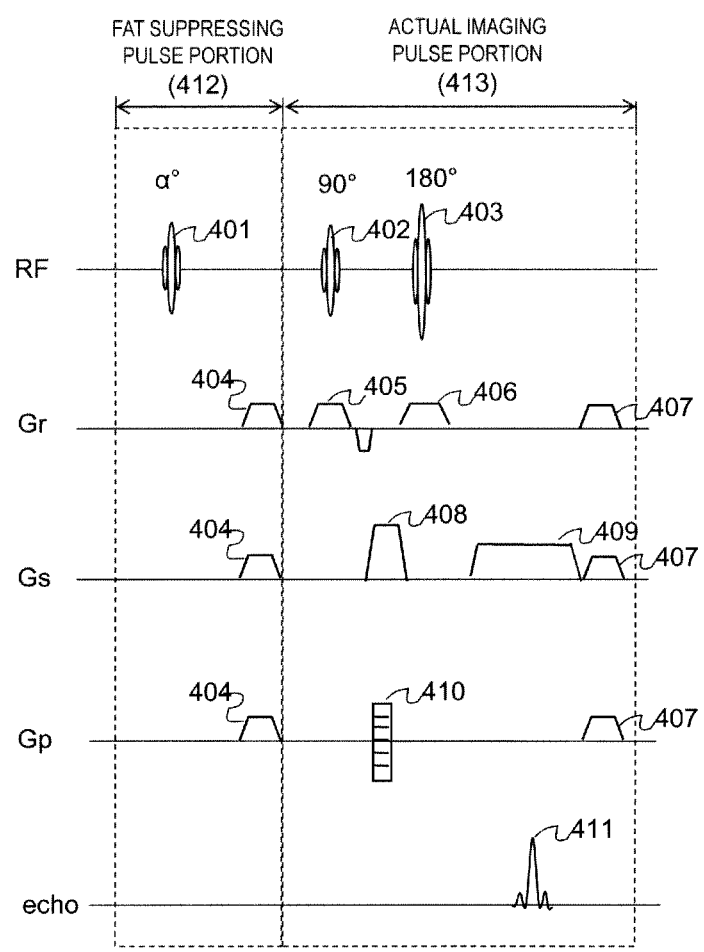
FIG. 2 is a sequence diagram showing an imaging sequence using a CHESS pulse.

First, a fat suppression imaging sequence using a CHESS pulse will be described. FIG. 2 is a sequence chart of the general fat suppression imaging sequence using a CHESS pulse. As shown in FIG. 2, the fat suppression imaging sequence has a fat suppressing pulse portion 412 for suppressing an echo signal from fat protons by using a CHESS pulse, and an actual imaging pulse portion 413 for measuring an echo signal to obtain an examinee image in which a signal from a fat tissue is suppressed. In FIG. 2, RF, Gr, Gs, Gp represent RF pulse, reading gradient magnetic field, slice gradient magnetic field and an application timing of phase encode gradient magnetic field, respectively. Furthermore, echo represents an echo signal detecting timing. In the fat suppression imaging sequence, the RF pulse (RF), the slice gradient magnetic field (Gs), the phase encode gradient magnetic field (Gp) and the reading gradient magnetic field (Gr) are applied at the timing described in the sequence chart, so that the echo signal (echo) is measured in the actual imaging pulse portion.

The fat suppressing pulse portion 412 is a pulse sequence portion for vanishing magnetization of fat protons in the imaging area. The CHESS pulse 401 for selectively exciting fat protons is applied in a non-slice selection style, that is, without applying any slice gradient magnetic field. The flip angle of the CHESS pulse 401 thereof is set to a predetermined angle (α°). The CHESS pulse 401 is applied in the non-slice selection style, and thus in the case of the multi-slice imaging, the CHESS pulse 401 is applied to all slices of an imaging target. By the fat suppressing pulse portion 412 described above, the magnetization of the fat protons in the imaging area is vanished just after the fat suppressing pulse portion 412, that is, just before the actual imaging pulse portion 413.

A spoiler gradient magnetic field pulse 404 for phase-dispersing the transverse magnetization of the fat protons excited by this CHESS pulse 401 is subsequent to the CHESS pulse 401 concerned. In FIG. 2, the spoiler gradient magnetic field pulse 404 of the fat suppressing pulse portion 412 is applied to the three axes of Gr, Gs and Gp, however, it may be applied to at least one axis.

The actual imaging pulse portion 413 is a pulse sequence portion for measuring an echo signal to reconstruct an image of the examinee 1, and any pulse sequence can be applied. In this case, an example in which a publicly known spin echo sequence is used will be described. In this spin echo sequence, a 90° exciting pulse 402, a 180° re-convergence pulse 403, slice selecting gradient magnetic fields 405, 406, reading gradient magnetic fields 408, 409, and a phase encode gradient magnetic field 410 are applied to measure an echo signal 411. Furthermore, after the echo signal 411 is measured, the spoiler gradient magnetic field 407 is applied to the three axes. By this actual imaging pulse portion 413, the echo signal 411 for the image of the examinee 1 is measured under the state that the magnetization of fat protons is vanished by the just-before fat suppressing pulse portion 412. As a result, a fat suppressed image in which the signal from the fat tissue is suppressed can be obtained.

Figure 13:
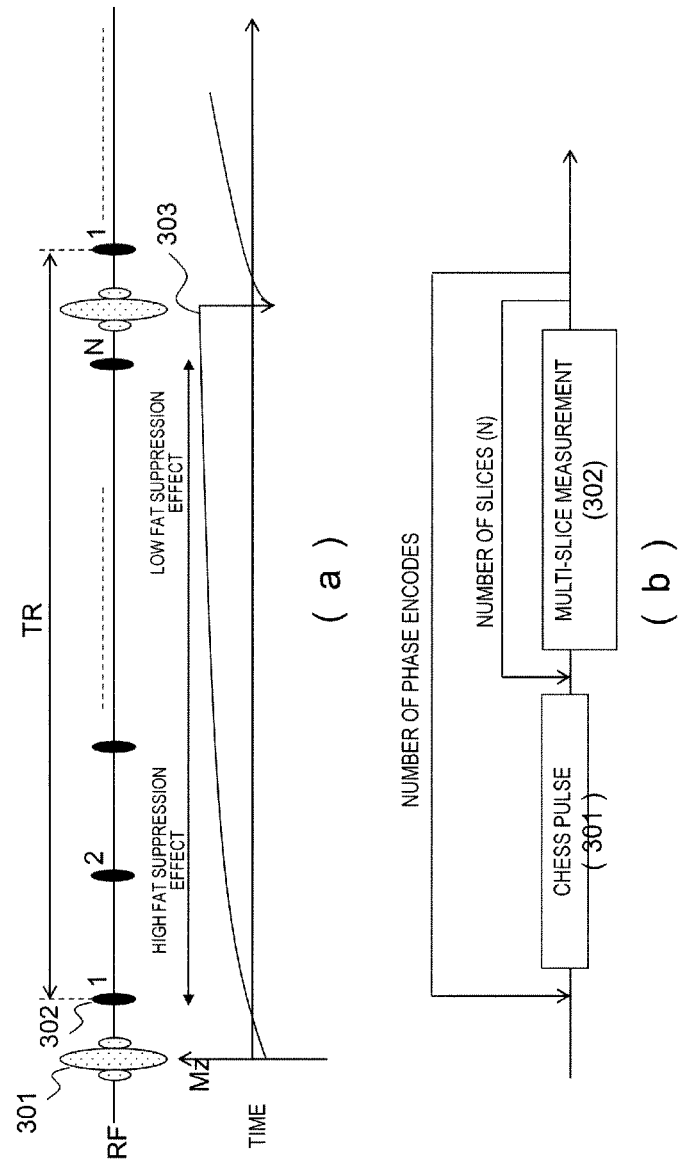
FIG. 13(a) is a sequence diagram showing the conventional multi-slice imaging using the CHESS pulse, and (b) is a schematic diagram showing the repeat loop thereof.

In the conventional multi-slice imaging based on the fat suppression imaging, after the fat suppressing pulse portion 412 (CHESS pulse 301), the actual imaging pulse portion 413 (exciting pulse 302) is repeated with the same phase encode amount at the frequency corresponding to the number of slices (in this case, N slices) as shown in FIG. 13. The combination thereof is repeated at the number of times corresponding to the number of phase encode steps to obtain a fat-suppressed image of each slice cross-section. By setting the sequence as described above, measurement of another slice can be performed during the repeat time TR, and thus the overall measurement time can be shortened. However, the effect of the CHESS pulse is reduced as the time elapses from the application of the CHESS pulse, and thus an image having a lower fat suppression effect is obtained as the measurement timing of the slice is later.

In this embodiment, data which are obtained at a timing having a high CHESS pulse effect is filled in the low spatial frequency area of the k space having a large effect on the contrast of the image or the like for any slice while effectively using the repeat time TR. In order to implement this, according to this embodiment, the phase encode amount and the CHESS pulse applying timing are controlled so as to measure the low spatial frequency area of the k space of each slice at the timing having the highest CHESS pulse effect just after the CHESS pulse is applied. A specific measurement control method will be described hereunder.

Figure 3:
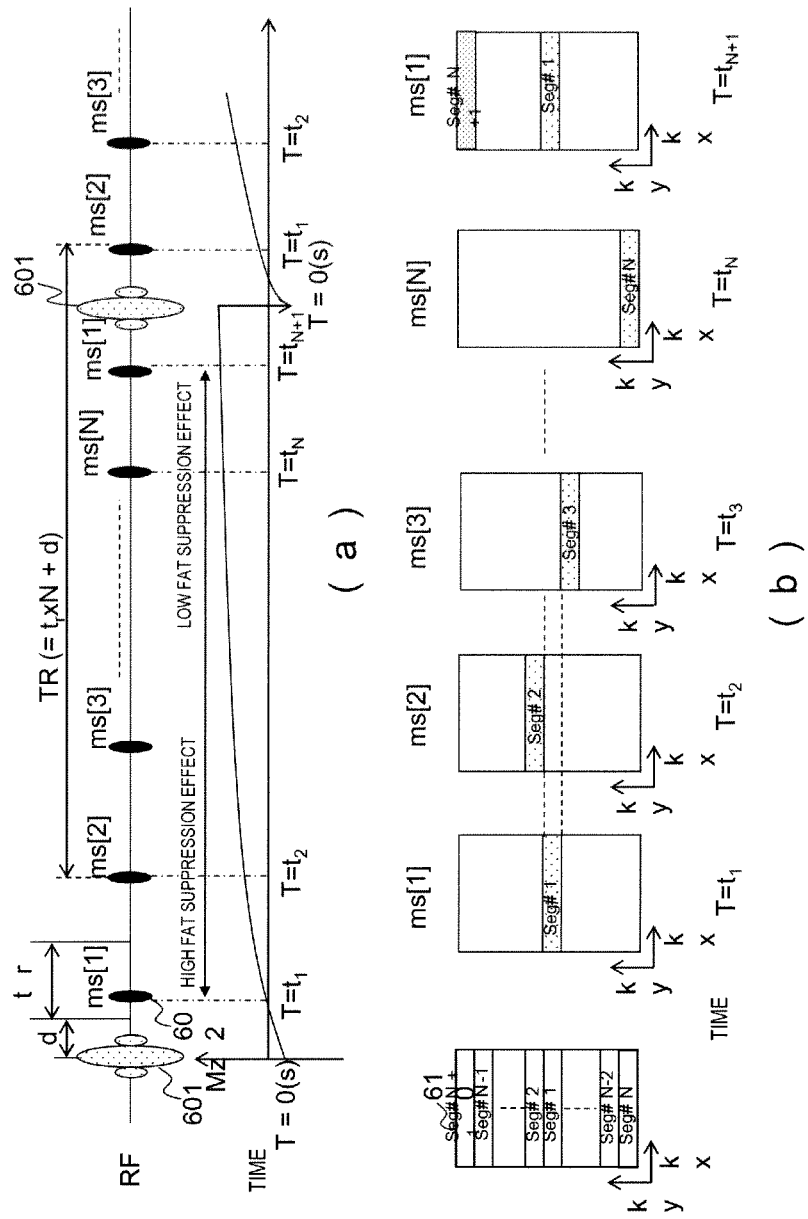
FIG. 3(a) is a sequence diagram of the imaging sequence of the embodiment of the present invention, and (b) is a diagram showing a measurement area of k space.
Figure 4:
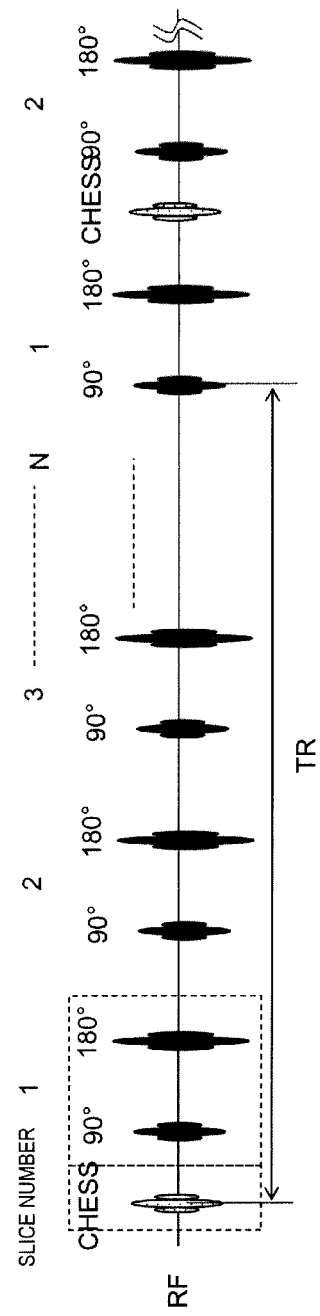
FIG. 4 is a sequence diagram of the imaging sequence according to the embodiment of the present invention.

FIG. 3 is a diagram showing the measurement control of this embodiment. FIG. 3(*a*) is a sequence diagram of the imaging sequence in the measurement control of this embodiment. FIG. 3(*b*) is a diagram showing time variation of a k space area 610 as a measurement target of the actual imaging in the measurement control of this embodiment. It will be hereunder referred to as "measurement" that an echo signal is detected by a phase encode amount for one slice and the data of the echo signal is disposed in the k space. In the sequence diagram to describe the subsequent imaging sequence, only the timing of an RF pulse sequence is shown. Furthermore, with respect to each measurement of the actual imaging pulse portion 413, the RF pulse is represented by one exciting pulse. For example, when the imaging sequence used for the actual imaging pulse portion 413 is an SE sequence, the exciting pulse 602 has a 90° pulse and a 180° pulse as shown in FIG. 4. This is represented by one exciting pulse 602 in FIG. 3(*a*). In FIG. 3(*a*), in order to explain time variation of a slice as a measurement target of the actual imaging, a recovery state of the longitudinal magnetization Mz of fat protons after application of the CHESS pulse 601 is shown in combination with the sequence diagram.

FIG. 3 shows an example in which the number of slices is equal to N, and it is assumed that the order of slices to be measured is defined by ms[i] (when the number of slices to be measured is represented by N, in this case, i=1 to N). Specifically, the measurement is advanced with incrementing i every time one slice is measured, and when the measurement has been finished until i=N, the measurement is repeated from i=1 again, and the multi-slice measurement is executed. The slice order is determined by the imaging condition (slice measurement order) set by the user. A slice ms[i] whose slice order is determined so as to measure the slice at the i-th turn is called as slice i.

In this embodiment, the measurement order of each slice is fixed, and the low spatial frequency area of the k space of each slice is measured just after the CHESS pulse 601 is applied. Therefore, the measurement frequency (N) at which all the slices make a round and the frequency of measurements executed during a period for which two adjacent, that is, nearest CHESS pulses 601 are applied (application interval) are set to be different from each other. Here, a case where the CHESS pulse 601 is applied every time the measurement is performed for the number of times corresponding to the sum of the number of slices and 1 will be described as an example. In this embodiment, the CHESS pulse 601 is inserted at an interval for which the measurements of N (number of slices) and 1 are executed.

Furthermore, as shown in FIG. 3(*a*), it is assumed that the time just after the CHESS pulse 601 is applied is set to T=0, and the application timing of the exciting pulse 602 of the slice i is set to $T=t_i$. In this embodiment, as described above, the measurements of (N+1) times are executed at the application interval of the CHESS pulse 601. For example, when the slice 1 is excited at $T=t_1$, the slice 2 is excited at $T=t_2$ and the slice N is excited at $T=t_N$. Furthermore, the slice 1 is also excited at $T=t_{N+1}$. That is, the slice excited by the exciting pulse 602 applied at the time of $T=t_{N+1}$ is identical to the slice which is first ($T=t_1$) excited after the CHESS pulse 601 is applied. When the time from the peak of the RF pulse (CHESS pulse 601) of the fat suppressing pulse portion 412 till start of the measurement of the actual imaging pulse portion 413 is represented by d and the exciting interval between slices (the value obtained by dividing the repeat time TR in the case of no CHESS pulse 601 by the number N of slices) is represented by $t_r$, the repeat time TR satisfies $TR=t_r \times N+d$.

Furthermore, the phase encode amount is adjusted so as to measure the low spatial frequency area of the k space just after the CHESS pulse 601 is applied. Specifically, the k space is first divided, in the phase encode direction, into segments whose number corresponds to the frequency (N+1) of measurements executed at the interval between the applications of the adjacent CHESS pulses 601, and the measurement is advanced while changing the measurement target segment every measurement from a lower spatial frequency area to a higher spatial frequency area in the segments in order of lapse time from application of the CHESS pulse 601 every time the CHESS pulse 601 is applied. In this case, the k space is divided into segments of the number corresponding to the sum of the slice number N and 1 in the phase encode direction. As shown in FIG. 3(b), the phase encode amount is changed in a centric order on a segment basis every slice, and the measurement is executed.

Numbers are successively allocated to the divisionally obtained segments in the centric order from the center area of the k space. Specifically, as shown in FIG. 3(b), numbers of Seg#1, Seg#2, . . . , Seg#i . . . , . . . Seg#N, Seg#N+1 are alternately allocated to positive and negative areas around the kx axis. When N is an even number, (N+1) becomes an odd number. Therefore, Seg#1 becomes an area containing the center of the k space. On the other hand, when N is an odd number, (N+1) is an even number, and Seg#1 and seg#2 are areas nearest to the center of the k space, and seg#2 becomes an area which is symmetric to Seg#1 with respect to the center of the k space.

The phase encode step in each segment is as follows. When the number of phase encode steps necessary to reconstruct an image of one slice (the number of all phase encode steps) is represented by Ps, it is divided into segments of (N+1) in this embodiment. Accordingly, the number Psn of the phase encode steps in one segment is obtained by dividing Ps by (N+1). Basically, Psn is equal to an integer part of a value obtained when Ps is divided by (N+1). The remainder of the value when ps is divided by (N+1) is allocated from an early segment in the measurement order, in this case, from a segment at the low spatial frequency area side. Accordingly, the phase encode step number Psn of each segment is equal to an integer part int(Ps/(N+1)) of Ps/(N+1) or int(Ps/(N+1))+1.

As shown in FIG. 3(b), in the measurement control of this embodiment, after the first CHESS pulse 601 is applied, the slice ms[1] excited by the exciting pulse 602 at the time $T=t_1$ measures the area of Seg#1 which is the low spatial frequency area of the k space. In this case, any phase encode amount of the phase encode step int (Ps/(N+1) (or int (Ps/(N+1)+1) contained in Seg#1 is applied to perform the measurement. The slice ms[2] excited by the exciting pulse 602 at the next time $T=t_2$ measures the area of Seg#2. The slice ms[3] excited at the next time $T=t_3$ measures the area of Seg#3. Likewise, the control is performed so as to measure the high spatial frequency area of the k space as the time T elapses. At the time $T=t_N$, the area of Seg#N of the slice ms[N] is measured, and at the time $T=_{N+1}$, the area of Seg#N+1 of the slice ms[1] is measured. The slice excited at the time $T=t_{N+1}$ is a slice ms[1] which is identical to the slice excited at the time $T=t_1$ just after the CHESS pulse 601 is applied.

When the measurement of the area of Seg#N+1 of the slice ms[1] is finished, a second CHESS pulse 601 is applied. The time T just after the application is set to T=0 again. The measurements of N+1 slices are successively executed in the order from Seg#1 to Seg#N+1 from the next slice, that is, from ms[2] while changing the segment area to be measured every slice. The last (N+1)-th measurement is executed on the area of Seg#N+1 of the slice ms[2]. That is, after the second CHESS pulse 601 is applied, as compared with the case where the first CHESS pulse 601 is applied, the same measurement is repeated while the relationship among the excited slices is shifted by one slice with respect to the time T. Furthermore, with respect to the data collection area of the k space, the area specified by the same segment as the first measurement with respect to the time T is measured.

Figure 5:
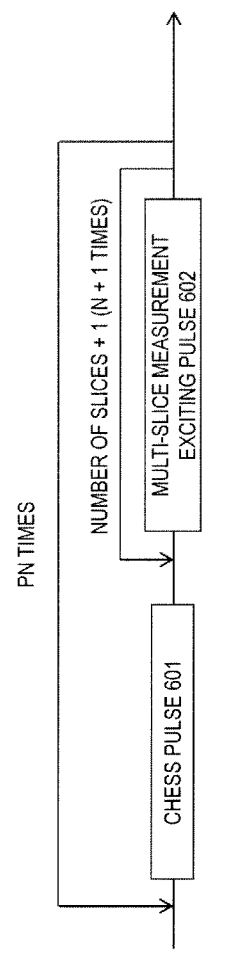
FIG. 5 is a schematic diagram showing a repeat loop of measurement control of the embodiment according to the present invention.

FIG. 5 is a schematic diagram showing a repeat loop in the measurement control of this embodiment. As shown in FIG. 5, according to this embodiment, one phase encode amount is applied to each slice as the actual imaging pulse portion 413 to perform multi-slice measurement based on application of the exciting pulse 602 every time the CHESS pulse 601 is applied as the fat suppressing pulse portion 412. In the actual imaging pulse portion 413, the measurement is started while the slices are shifted by one slice from the application time of the just-previous CHESS pulse 601 with respect to the slices and from the same area with respect to the segments. Thereafter, the slices are varied in a predetermined measurement order, and the segments are varied in the centric order, thereby performing the measurements of (N+1) times based on the application of the exciting pulse 602. The measurement based on the fat suppressing pulse portion 412 and the actual imaging pulse portion 413 as described above is repeated at PN times until the k space of all the slices are filled (PN represents the minimum natural number above Ps×N(N+1), and Ps represents the number of phase encode steps of one slice), and an image is reconstructed by using the obtained result. When the measurement in the same segment of the same slice is performed, a phase encode amount which has not yet been measured until that time is allocated.

Figure 6:
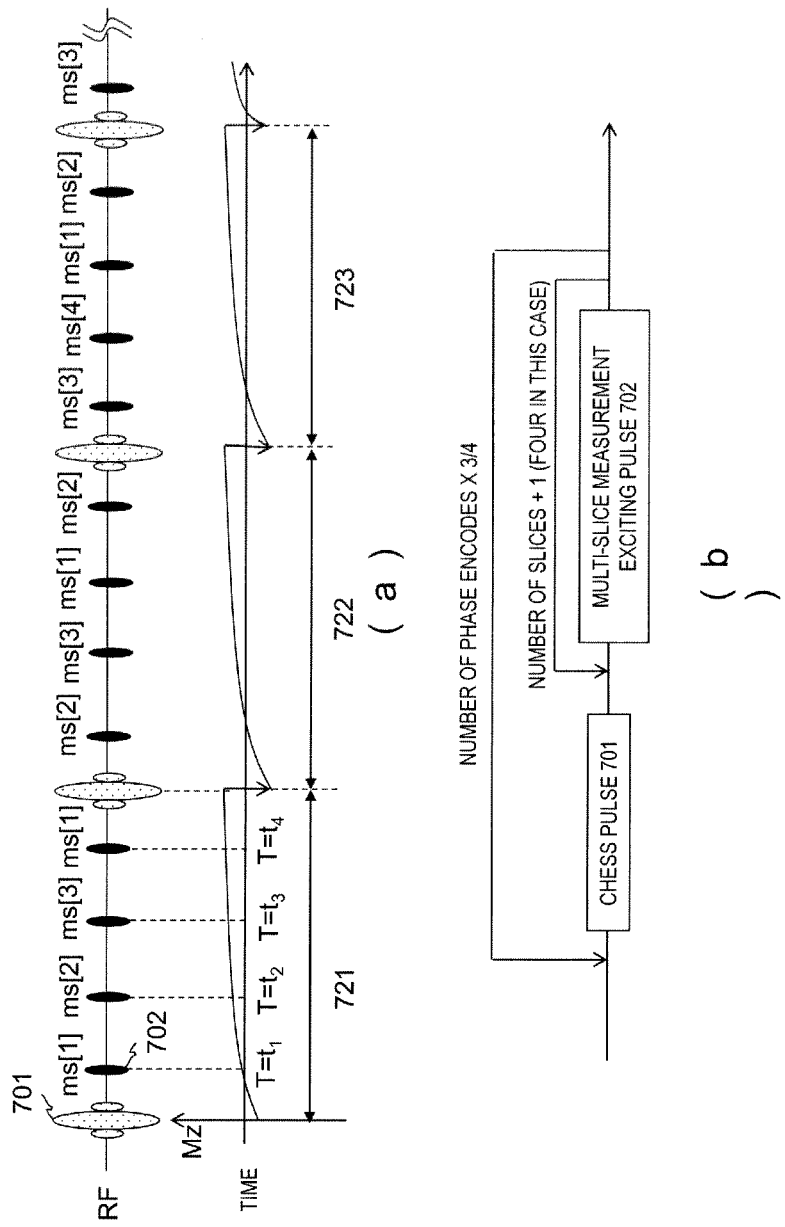
FIG. 6(a) is a sequence diagram of the imaging sequence for three slices of the embodiment according to the present invention, (b) is a schematic diagram showing the repeat loop thereof.
Figure 7:
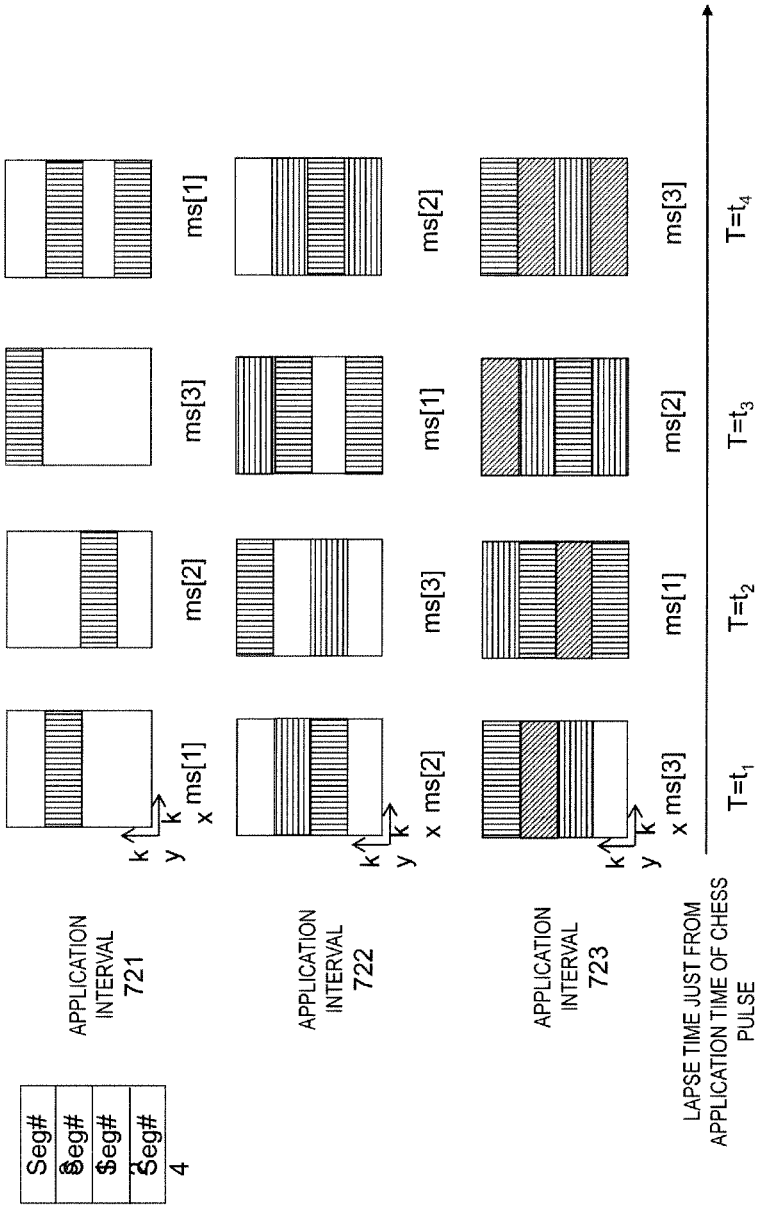
FIG. 7 is a diagram showing a measurement area of k space for three slices of the embodiment according to the present invention.

Here, the specific measurement control will be described with reference to FIGS. 6 and 7 by applying to a case where the number of slices is set to three. FIG. 6(a) is a sequence diagram showing only RF pulses (701, 702) of this embodiment. In addition, it shows a longitudinal magnetization recovery state of fat protons after the CHESS pulse 701 is applied. FIG. 6(b) is a schematic diagram showing a repeat loop in this measurement control. FIG. 7 shows measurement areas of the k space which correspond to the application time T from each CHESS pulse.

In this case, the number N of slices is set to three, and thus the k space is divided into four (slice number N+1). Furthermore, the respective segments are successively represented by Seg#1, Seg#2, Seg#3 and Seg#4 in the order from the lower spatial frequency area. FIG. 7 is a diagram showing the variation of the measurement area of the k space. The abscissa axis represents the time T from the CHESS pulse 701, and the ordinate axis shows the measurement areas of the k space at the three application intervals as the application intervals of the adjacent CHESS pulses 701 which are successively arranged from the upper side.

As shown in FIG. 6, the number of slices is set to three, and the order of the slices to be measured is defined by ms[i] (i=1 to 3). First, the CHESS pulse 701 is applied, and subsequently respective exciting pulses 702 of the actual imaging are successively applied at the time $T=t_1$, $t_2$, $t_3$, $t_4$, respectively, whereby the slices are successively excited in the following order of slice ms[1], slice ms[2], slice ms[3] and slice ms[1]. At this time, with respect to the areas of the k space to be measured on the basis of the time T just after the CHESS pulse 701 is applied, as shown in FIG. 7, at the application interval 721 after the first CHESS pulse 701 is applied, the areas of Seg#1, seg#2, Seg#3 and Seg#4 are measured at the time $T=t_1$, $t_2$, $t_3$, $t_4$, respectively.

In this example, at the application interval 721 after the first CHESS pulse 701 is applied, at the time $T=t_1$, the slice ms[1] is excited and the area of Seg#1 of the slice ms[1] is measured. At the time $T=t_2$, the slice ms[2] is excited and the area of Seg#2 of the slice ms[2] is measured. At the time $T=t_3$, the slice ms[3] is excited and the area of Seg#3 of the slice ms[3]

is measured. Furthermore, at the time $T=t_4$, the slice ms[1] is excited and the area of Seg#4 of the slice ms[1] is measured.

At the application interval 722 after the second CHESS pulse 701 is applied, the slices to be excited at the same times Tare shifted by one slice, and the same measurement is repeated. That is, at the time $T=t_1$, the slice ms[2] is excited, and the area of Seg#1 of the slice ms[2] is measured. At the time $T=t_2$, the slice ms[3] is excited, and the area of Seg#2 of the excited slice is measured. At the time $T=t_3$, the slice ms[1] is excited, and the area of Seg#3 of the excited slice is measured. At the time $T=t_4$, the slice ms[2] is excited, and the area of Seg#4 of the excited slice is measured.

Likewise, at the application interval 723 after the third CHESS pulse 701 is applied, at the time $T=t_1$, the slice ms[3] is excited, and the area of Seg#1 of the excited slice is measured. At the time $T=t_2$, the slice ms[1] is excited, and the area of Seg#2 of the excited slice is measured. At the time $T=t_3$, the slice ms[2] is excited, and the area of Seg#3 of the excited slice is measured. At the time $T=t_4$, the slice ms[3] is excited, and the area of Seg#4 of the excited slice is measured.

In this example, one encode data is collected with respect to each segment of each k space for all the slices through the above operation. This operation is repeated while the phase encode frequency and the phase encode amount contained in each segment are varied, and the measurement is finished at the time when the k spaces of all the slices are filled. An image of the three slices is reconstructed from the obtained k space data.

As described above, according to this embodiment, in the multi-slice imaging using the application of the pre-pulse as the CHESS pulse in combination, the measurement for each slice is controlled so that after the application of the CHESS pulse, the low spatial frequency area of the k space is measured in a time zone having a high fat suppression effect and the high spatial frequency area of the k space is measured in a time zone having a low fat suppression effect by using the repeat time TR. Accordingly, according to this embodiment, for all the slices, data obtained at a timing having a large pre-pulse effect are arranged in the low spatial frequency area of the k space having a large effect on the contrast or the like. Therefore, according to this embodiment, an excellent fat suppression image can be obtained for all slices without applying any CHESS pulse every time an exciting pulse of the actual imaging is applied (measured). Furthermore, as compared with the case where the CHESS pulse is applied every time the exciting pulse of the actual imaging is applied (measured), an image having image quality of the same level can be obtained at a smaller application frequency of the CHESS pulse, so that the overall imaging time can be shortened and SAR can be also reduced.

Figure 8:
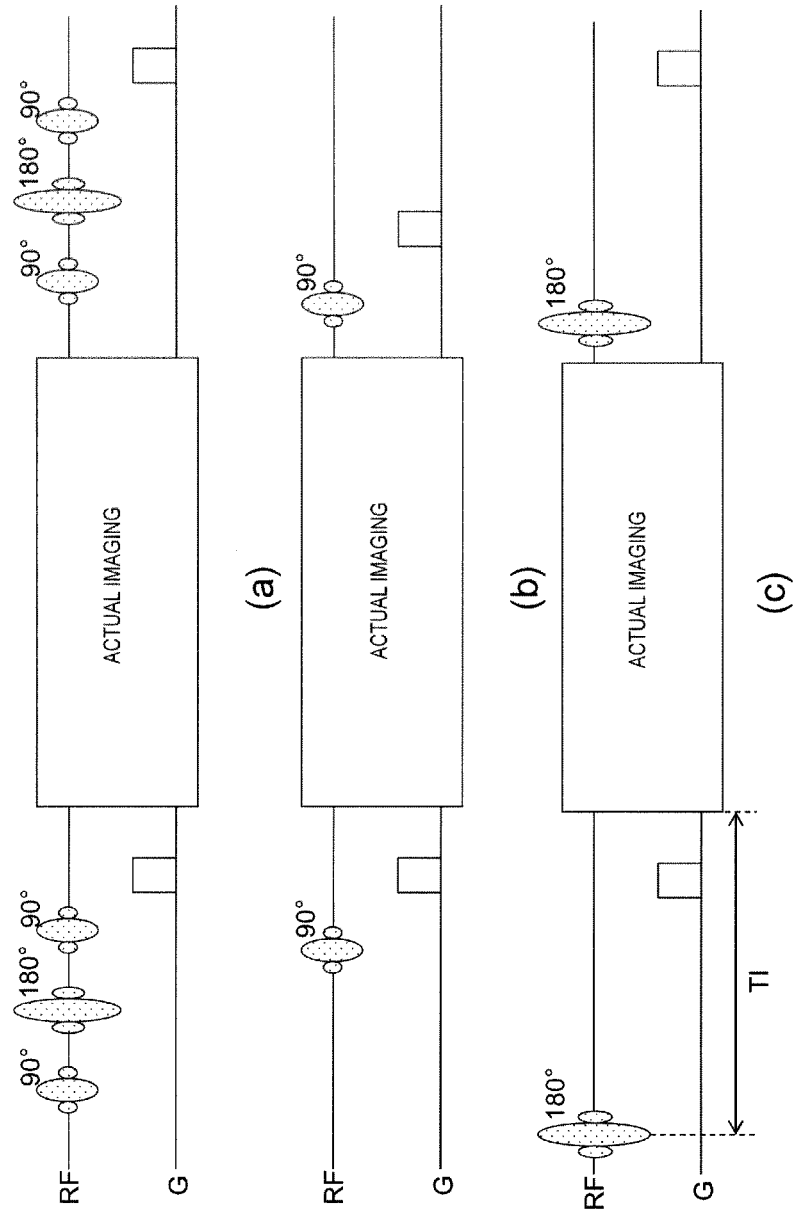
FIG. 8 is a sequence diagram showing imaging sequence using another pre-pulse according to the embodiment of the present invention, (a) is a sequence diagram of T2 preparation pulses, (b) is a sequence diagram of pre-saturation pulses, and (c) is a sequence diagram of IR pulses.

This embodiment is described above by applying to the case where the CHESS pulse is used as the pre-pulse to suppress fat. However, this embodiment is not limited to this style. The suppression target species may be water for chemical shift imaging. Furthermore, the foregoing description is made by applying to the case where the suppressing pulse is applied. However, the pre-pulse is not limited to this pulse. For example, it may be a publicly-known T2 preparation pulse for giving T2 contrast, a pre-saturation pulse for suppressing a slice in-plane or out-of-plane signal, a publicly-known IR (Inversion recovery) pulse for giving T1 contrast or the like. FIG. 8 shows imaging sequences when these pulses are used as the pre-pulse. Here, FIG. 8(a) shows an example of the T2 preparation pulse, FIG. 8(b) shows an example of the pre-saturation pulse, and FIG. 8(c) shows an example of the IR pulse.

Furthermore, this embodiment is described by applying to the case where the pre-pulse is the CHESS pulse. As described above, when the pre-pulse is such a pulse that the effect just after the pulse is applied is highest, however, it is subsequently monotonically reduced, a method of measuring each segment in the centric order as described above is appropriate. However, various measuring orders such as sequential order, anti-centric order, etc. may be considered in accordance with the pre-pulse. At any rate, the control may be performed so that the low frequency area of the k space of each slice is measured at the timing having the highest pre-pulse effect.

Figure 9:
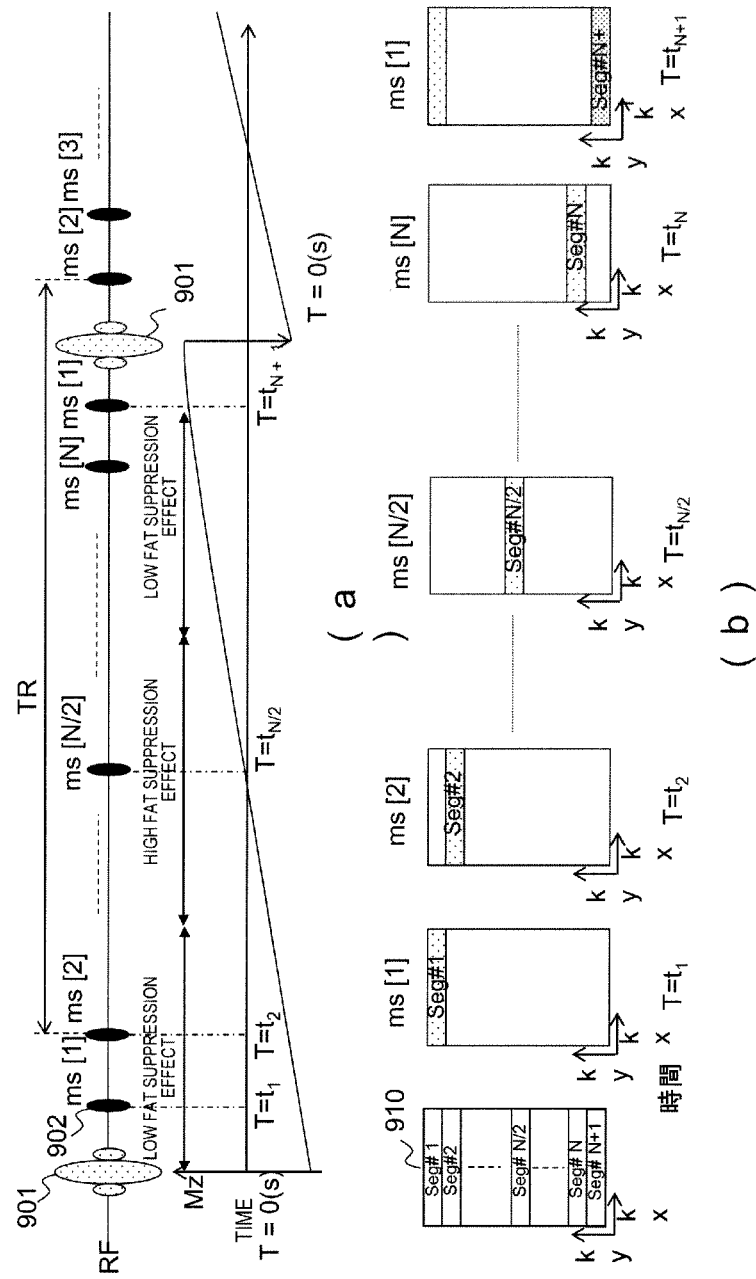
FIG. 9(a) is a sequence diagram when measurement is executed in a sequential order in the embodiment of the present invention, (b) is a diagram showing a measurement area of the k space.

Here, FIG. 9 shows a case where measurement target segments are moved in the sequential order. Here, an example in which an IR pulse 901 is used as a pre-pulse will be described. FIG. 9(a) is a sequence diagram showing time variation of a measurement target slice when measurement control is performed so that the measurement is made in the sequential order every segment, and also shows the recovery state of the longitudinal magnetization of fat protons after the IR pulse 901 is applied. FIG. 9(b) is a diagram showing time variation of the k space area 910 as a measurement target of the actual imaging in the example of the measurement control. In this case, it is assumed that the number of slices is represented by N and the phase encode step is divided into segments of N+1. In this case, it is assumed that the application intensity of the IR pulse 901 is adjusted so that the fat suppression effect of the IR pulse 901 is highest at the (N/2)-th measurement time after the IR pulse 901 is applied. Furthermore, it is assumed that at the application interval of the IR pulse 901, the exciting pulse 902 is applied at the frequency of (N+1) times to measure slices of N+1.

In this case, the measurement is also executed for the (number of slices N+1) times while the measurement target slice is changed one by one during the period from the application of the first IR pulse 901 till the application of the next IR pulse 901 and the measurement target segment is also changed one by one in the sequential order in connection with the change of the slice. By repeating this operation, the k spaces of all the slices are filled.

When the measurement target segment is varied in the sequential order, it is not necessarily required to make the measurement from the segment at the end. In the example of FIG. 9, the intensity of the IR pulse 901 is adjusted so that the effect of the IR pulse 901 is highest at the intermediate of the application interval of the IR pulse 901 (at the (N/2)-th measurement time), and the lowest spatial frequency area of the k space is measured when the effect of the IR pulse 901 is highest. The timing having the highest effect of the IR pulse 901 is a timing at which the longitudinal magnetization of fat protons is equal to zero. However, this embodiment is not limited to this style. For example, when the timing having the highest pre-pulse effect is an M-th measurement timing, a start segment may be adjusted so as to measure a segment containing the lowest spatial frequency area at the M-th timing.

Figure 10:
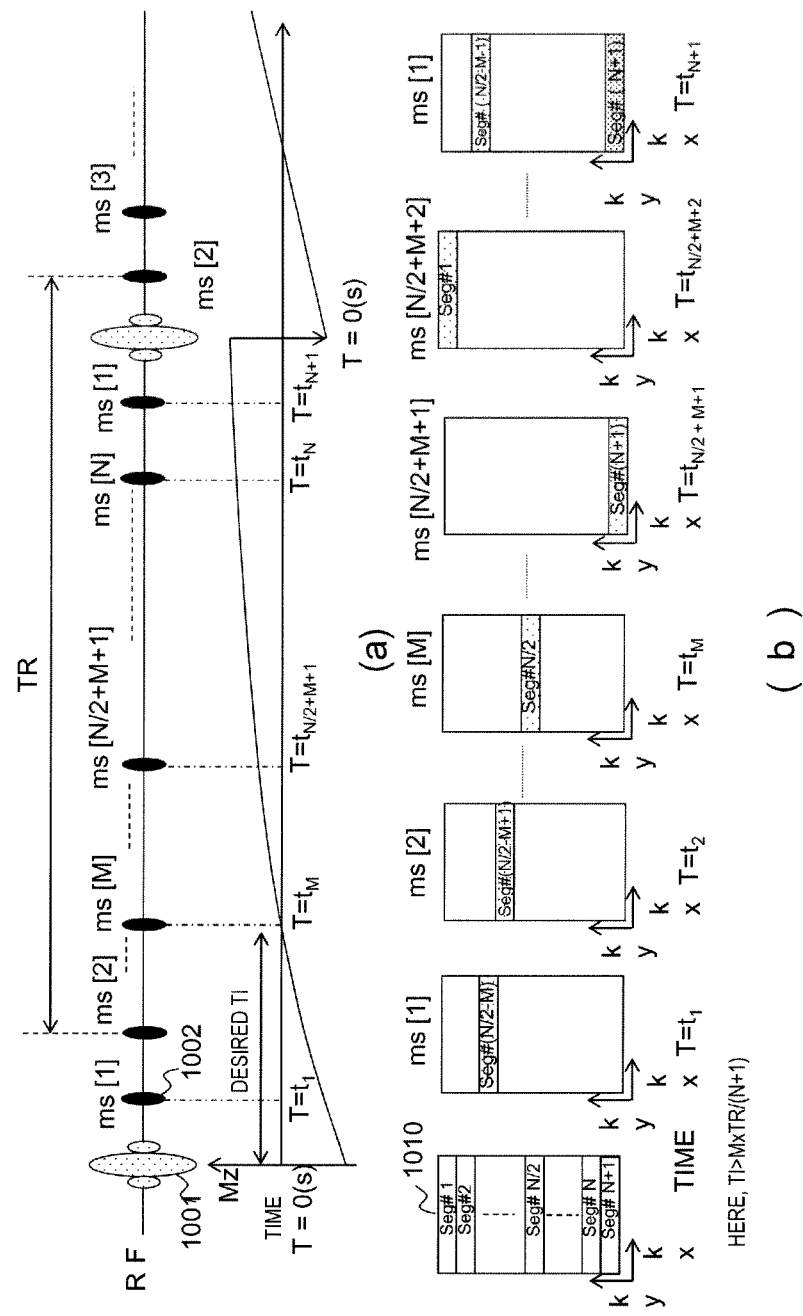
FIG. 10(a) is another sequence diagram when measurement is executed in a sequential order in the embodiment of the present invention, and (b) is a diagram showing a measurement area of the k space.

FIG. 10(a) shows the imaging sequence at this time. In this case, the imaging sequence will be described by applying to a case where an IR pulse 1001 is used as a pre-pulse. Furthermore, at the application interval of the IR pulse 1001, an exciting pulse 1002 is applied at the frequency of the number N of slices+1 to perform the measurement at the (N+1) times.

With respect to the IR pulse, after the application of the IR pulse, the time at which the highest effect can be obtained is different in accordance with a desired contrast for a reconstructed image. As shown in FIG. 10(b), the segment area is sequentially measured according to the time T. The start segment is adjusted so that the segment area at the center of the k space 1010 (Seg#N/2 in the example of FIG. 10(b)) is measured for a desired TI time (T=$t_M$). When TI is larger than M×TR/(N+1), that is, when the measurement can be performed at only M times (M represents an integer of N/2 or less) for the TI time, as shown in FIG. 10(b), the measurement is started from Seg#(N/2−M) of the slice ms[1] at T=$t_1$, the slice and the segment are varied in the same manner as described above to execute the measurement of Seg#(N+1) of the slice ms[N/2+M+1] at T=$t_{N/2+M+1}$, and then the measurement of the area from seg#1 to Seg#(N/2−M−1) of each slice from the slice ms[N/2+M+2] to the slice ms[1] is executed.

Furthermore, in the above embodiment, the measurement is executed at the frequency corresponding to the number N of slices+1 at the application interval of the pre-pulse such as the CHESS pulse or the like, however, this embodiment is not limited to this style. It is necessary that the measurement frequency is not equal to the number N of slices, and it may be equal to the number N of slices+L (L represents an integer other than 0 and satisfies −N<L<N). In this case, the phase encode step is divided to segments whose number corresponds to the number of measurement times. The imaging sequence at this time is shown in FIG. 11(a), and the variation of the measurement segment of the k space 1110 is shown in FIG. 11(b). As shown in these figures, an exciting pulse 1102 is applied at the N+L times at the application interval of a pre-pulse 1101, the slices are changed in a predetermined order, and the measurement is executed at the N+L times. The phase encode step is divided to segments whose number corresponds to the number of measurement times executed at the application interval of the pre-pulse 1101, and the phase encode amount is varied on a segment basis every measurement executed at the application interval.

Figure 11:
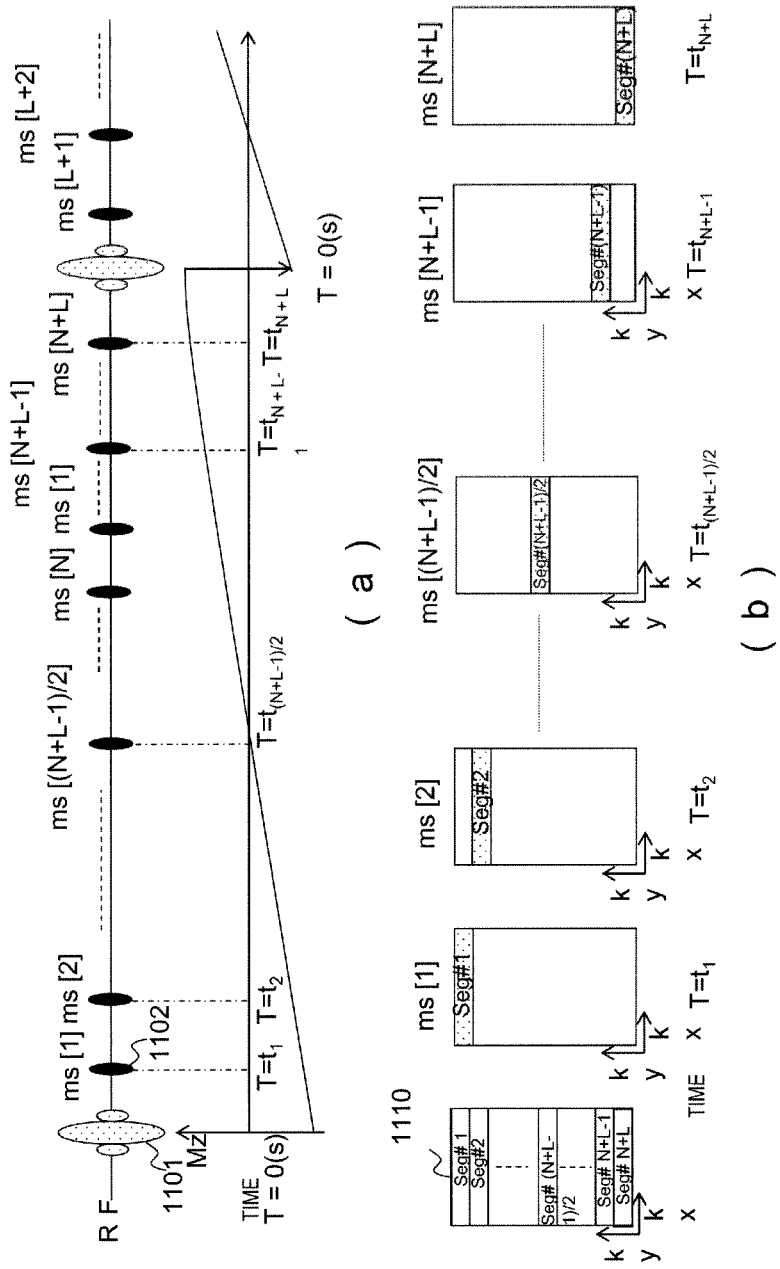
FIG. 11(a) is another sequence diagram of imaging sequence of the embodiment of the present invention, and (b) is a diagram showing a measurement area of the k space thereof.
Figure 12:
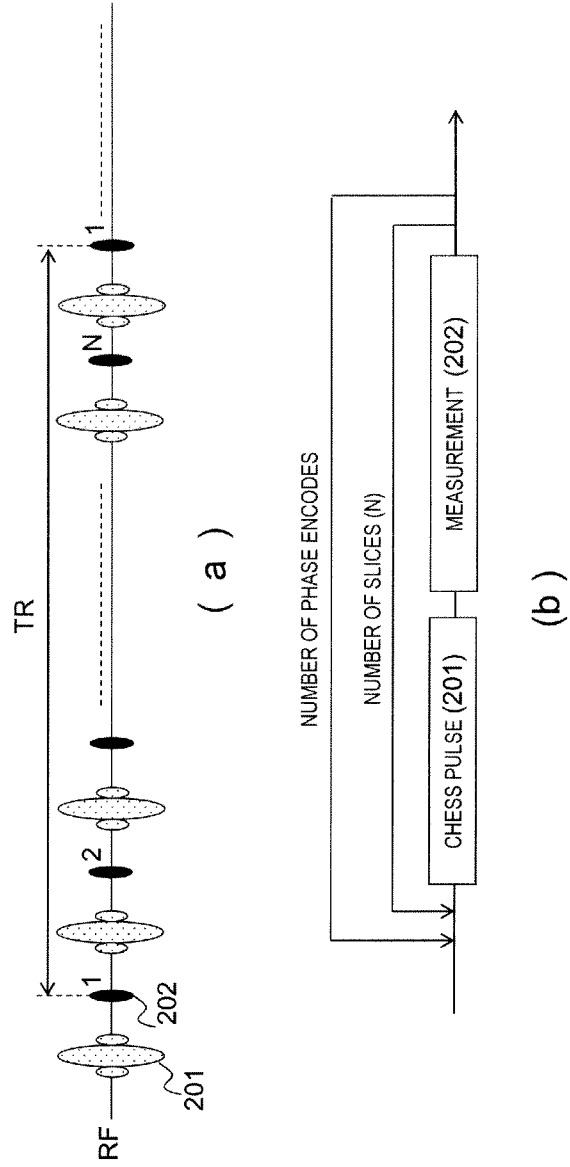
FIG. 12(a) is a sequence diagram of conventional multi-slice imaging using a CHESS pulse, and (b) is a schematic diagram showing a repeat loop thereof.

FIG. 11 shows a case where the measurement is executed in a sequential order on a segment basis. When the pre-pulse is a pulse which has the highest effect just after the pulse is applied and then monotonically decreases, the measurement is likewise executed in the centric order.

In the example of FIG. 11, L represents an integer of 2 or more which satisfies the foregoing condition, whereby the number of application times of the CHESS pulse can be reduced more greatly as compared with the above embodiment, and thus SAR can be more greatly reduced. Furthermore, the overall imaging time can be also reduced.

DESCRIPTION OF REFERENCE NUMERALS

1 examinee, 2 magnetostatic field generating system, 3 gradient magnetic field generating system, 4 sequencer, 5 transmission system, 6 reception system, 7 signal processing system, 8 central processing unit (CPU), 9 gradient magnetic field coil, 10 gradient magnetic field power supply, 11 high-frequency oscillator, 12 modulator, 13 high-frequency amplifier, 14a high-frequency coil (transmission coil), 14b high-frequency coil (reception coil), 15 signal amplifier, 16 orthogonal phase detector, 17 A/D converter, 18 storage device, 19 external storage device, 20 display device, 23 trackball or mouse, 24 keyboard, 25 operating unit, 201 CHESS pulse, 202 exciting pulse, 301 CHESS pulse, 302 exciting pulse, 401 CHESS pulse, 402 exciting pulse, 403 re-convergence pulse, 404 spoiler gradient magnetic field pulse, 405 slice selecting gradient magnetic field, 406 slice selecting gradient magnetic field, 407 spoiler gradient magnetic field, 408 reading gradient magnetic field, 409 reading gradient magnetic field, 410 phase encode gradient magnetic field, 411 echo signal, 412 fat suppressing pulse portion, 413 actual imaging pulse portion, 601 CHESS pulse, 602 exciting pulse, 610 k space area, 701 CHESS pulse, 702 exciting pulse, 721 application interval, 722 application interval, 723 application interval, 901 CHESS pulse, 902 exciting pulse, 910 k space area, 1001 CHESS pulse, 1002 exciting pulse, 1010 k space area

The invention claimed is:

1. A magnetic resonance imaging apparatus for imaging a plurality of different slice planes characterized by comprising:
pre-pulse applying means configured to apply a pre-pulse for affecting in-plane magnetization of all slices of a measurement target; measuring means configured to make a measurement for applying one phase encode amount for one slice plane to obtain an echo signal and disposing the echo signal in a k space; and control means configured to control operations of the pre-pulse applying means and the measuring means, wherein the control means has first control means configured to control to repeat an operation of executing the measurement once according to a predetermined order for all slice planes of the measurement target after a first pre-pulse is applied while a phase encode amount is varied in a predetermined order until all k spaces of all slices are filled, and second control means configured to control the pre-pulse applying means so that the pre-pulse is applied every time the measurement is executed for the number of times which is different from the number of the slices of the measurement target and a multiple number of the number of the slices, and the first control means sets an initial phase encode amount of each slice so as to measure a low spatial frequency area of the k space at a timing having a large effect of the pre-pulse.

2. The magnetic resonance imaging apparatus according to claim 1, wherein the pre-pulse is a pulse for monotonically reducing the effect, and the first control means divides the k space into segments whose number corresponds to the number of measurement times executed while the pre-pulse applying means applies the pre-pulse, and varies the phase encode amount every measurement on a segment basis in a centric order.

3. The magnetic resonance imaging apparatus according to claim 1, wherein the pre-pulse is a pulse having the maximum effect at a predetermined timing after application thereof, and the first control means divides the k space into segments whose number corresponds to the number of measurement times executed while the pre-pulse applying means applies the pre-pulse, varies the phase encode amount every measurement on a segment basis in a sequential order, and sets an initial phase encode amount so as to obtain data to be disposed in a segment containing the lowest spatial frequency area at a timing having the highest effect of the pre-pulse.

4. The magnetic resonance imaging apparatus according to claim 1, wherein the pre-pulse is a pulse for suppressing an echo signal from hydrogen protons of fat molecules.

5. The magnetic resonance imaging apparatus according to claim 1, wherein the pre-pulse is a pulse for selectively exciting an unnecessary tissue.

6. The magnetic resonance imaging apparatus according to claim 1, wherein the pre-pulse is a T2 preparation pulse.

7. The magnetic resonance imaging apparatus according to claim 1, wherein the pre-pulse is an IR (Inversion Recovery) pulse.

8. A magnetic resonance imaging method for imaging a plurality of different slice planes, characterized by comprising:
a pre-pulse applying step that applies a pre-pulse for affecting in-plane magnetization of all slices of a measurement target; a measuring step that makes a measurement for applying one phase encode amount for one slice plane to obtain an echo signal and disposes the echo signal in a k space; and a control step that controls operations of the pre-pulse applying means and the measuring means, wherein the control step has a first control step that controls to repeat an operation of executing the measurement once according to a predetermined order for all slice planes of the measurement target after a first pre-pulse is applied while a phase encode amount is varied in a predetermined order until all k spaces of all slices are filled, and a second control step that controls the pre-pulse applying means so that the pre-pulse is applied every time the measurement is executed for the number of times which is different from the number of the slices of the measurement target and a multiple number of the number of the slices, and the first control step sets an initial phase encode amount of each slice so as to measure a low spatial frequency area of the k space at a timing having a large effect of the pre-pulse.

9. The magnetic resonance imaging method according to claim 8, wherein the pre-pulse is a pulse for monotonically reducing the effect, and the first control step divides the k space into segments whose number corresponds to the number of measurement times executed while the pre-pulse applying step applies the pre-pulse, and varies the phase encode amount every measurement on a segment basis in a centric order.

10. The magnetic resonance imaging method according to claim 8, wherein the pre-pulse is a pulse having the maximum effect at a predetermined timing after application thereof, and the first control step divides the k space into segments whose number corresponds to the number of measurement times executed while the pre-pulse applying step applies the pre-pulse, varies the phase encode amount every measurement on a segment basis in a sequential order, and sets an initial phase encode amount so as to obtain data to be disposed in a segment containing the lowest spatial frequency area at a timing having the highest effect of the pre-pulse.

11. The magnetic resonance imaging method according to claim 8, wherein the pre-pulse is a pulse for suppressing an echo signal from hydrogen protons of fat molecules.

12. The magnetic resonance imaging method according to claim 8, wherein the pre-pulse is a pulse for selectively exciting an unnecessary tissue.

13. The magnetic resonance imaging method according to claim 8, wherein the pre-pulse is a T2 preparation pulse.

14. The magnetic resonance imaging method according to claim 8, wherein the pre-pulse is an IR (Inversion Recovery) pulse.

* * * * *